United States Patent
Cromwell

(10) Patent No.: US 6,198,630 B1
(45) Date of Patent: *Mar. 6, 2001

(54) METHOD AND APPARATUS FOR ELECTRICAL AND MECHANICAL ATTACHMENT, AND ELECTROMAGNETIC INTERFERENCE AND THERMAL MANAGEMENT OF HIGH SPEED, HIGH DENSITY VLSI MODULES

(75) Inventor: S. Daniel Cromwell, Penryn, CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,127

(22) Filed: Jan. 20, 1999

(51) Int. Cl.[7] ........................................................ H05K 7/20

(52) U.S. Cl. ..................... 361/704; 361/692; 361/702; 361/707; 361/709; 257/718; 174/35 R; 174/16.3; 165/80.3

(58) Field of Search .................................... 361/690–695, 361/818, 688, 697, 718–720, 816, 699, 700–710, 712–717, 802–803; 257/706–727; 174/15.1, 16.3, 252, 52.4, 35 R; 165/80.3, 80.4, 185; 439/526, 71, 79, 73, 66

(56) References Cited

U.S. PATENT DOCUMENTS

| | | |
|---|---|---|
| 4,067,237 | 1/1978 | Arcella . |
| 4,120,019 | 10/1978 | Arii et al. . |
| 4,167,031 | 9/1979 | Patel . |

(List continued on next page.)

OTHER PUBLICATIONS

"Spring–Loaded Heat Sinks for VLSI Packages", Research Disclosure, No. 318, Kenneth Mason Publications, Ltd., England, Oct. 1990.*
IBM 198 Technical Disclosure Bulletin, "Heat Sink Attachment for Improved Electromagnetic Compatibility and Shock Performance", vol. 38, pp. 383–385, Mar. 1995.*
S.A. Curtis, et al., "Surface Mount Chip Packaging", IBM Technical Disclosure Bulletin, vol. 28—No. 12, May 1986, pp. 5531–5532.*
S.W. Lee, et al., "Low Profile Heat Sink", IBM Technical Disclosure Bulletin, vol. 28—No. 12, May 1986, pp. 5172–5173.*
F.J. DeMaine, et al., "Attachable Heat Sink For Pluggable Modules", IBM Technical Disclosure Bulletin, vol. 22—No. 3, Aug. 1979, pp. 960–961.*

(List continued on next page.)

*Primary Examiner*—Leo Picard
*Assistant Examiner*—Michael Datskovsky
(74) *Attorney, Agent, or Firm*—Christine H. Smith

(57) ABSTRACT

A method and apparatus for assembling a high speed, high density VLSI module in a computer system that enables attachment, support, electromagnetic interference containment, and thermal management of the VLSI module. The present invention packages a high speed, high density VLSI module within a limited space and in a single assembly that attaches, aligns, and manages electromagnetic interference and heat dissipation of the VLSI module. The present invention aligns a land grid array of a circuit board and an interposer socket assembly, and the interposer socket assembly and a land grid array of the VLSI module; in the single VLSI module assembly. An even, controlled load is placed on the interposer socket interface thereby reducing the risk of damage to the interposer socket from overloaded connections between the land grid array of the VLSI module, the interposer socket assembly, and the land grid array of the circuit board. The present invention is easy-to-use in upgrading and handling of the VLSI module.

14 Claims, 7 Drawing Sheets

U.S. PATENT DOCUMENTS

| | | | |
|---|---|---|---|
| 4,342,069 | | 7/1982 | Link . |
| 4,376,560 | | 3/1983 | Olsson et al. . |
| 4,506,938 | * | 3/1985 | Madden .............................. 339/17 CF |
| 4,540,226 | | 9/1985 | Thompson et al. . |
| 4,563,383 | | 1/1986 | Kuneman et al. . |
| 4,589,716 | | 5/1986 | Williams . |
| 4,638,854 | * | 1/1987 | Noren . |
| 4,652,973 | * | 3/1987 | Baker et al. ........................... 361/395 |
| 4,675,783 | * | 6/1987 | Murase et al. . |
| 4,707,726 | | 11/1987 | Tinder . |
| 4,829,432 | | 5/1989 | Hershberger et al. . |
| 4,858,093 | * | 8/1989 | Sturgeon . |
| 4,874,318 | | 10/1989 | Spencer . |
| 4,951,740 | | 8/1990 | Peterson et al. . |
| 4,961,633 | | 10/1990 | Ibrahim et al. . |
| 4,975,825 | * | 12/1990 | Huss et al. . |
| 4,978,638 | | 12/1990 | Buller et al. . |
| 5,010,292 | * | 4/1991 | Lyle, Jr. . |
| 5,060,112 | | 10/1991 | Cocconi . |
| 5,078,622 | | 1/1992 | Hunt et al. . |
| 5,118,925 | | 6/1992 | Mims et al. . |
| 5,131,859 | * | 7/1992 | Bowen et al. . |
| 5,136,119 | | 8/1992 | Leyland . |
| 5,162,974 | | 11/1992 | Currie . |
| 5,208,731 | | 5/1993 | Blomquist . |
| 5,229,915 | | 7/1993 | Ishibashi et al. . |
| 5,241,453 | * | 8/1993 | Bright et al. .......................... 361/704 |
| 5,252,782 | * | 10/1993 | Cantrell et al. ..................... 174/35 R |
| 5,276,585 | | 1/1994 | Smithers . |
| 5,307,239 | | 4/1994 | McCarty et al. . |
| 5,311,395 | | 5/1994 | McGaha et al. . |
| 5,311,397 | * | 5/1994 | Harshberger et al. . |
| 5,313,099 | | 5/1994 | Tata et al. . |
| 5,329,426 | * | 7/1994 | Villani ................................. 361/719 |
| 5,339,214 | * | 8/1994 | Nelson . |
| 5,359,493 | | 10/1994 | Chiu . |
| 5,359,768 | | 11/1994 | Haley . |
| 5,367,193 | | 11/1994 | Malladi . |
| 5,386,338 | | 1/1995 | Jordan et al. . |
| 5,387,554 | | 2/1995 | Liang . |
| 5,394,607 | | 3/1995 | Chiu et al. . |
| 5,398,822 | | 3/1995 | McCarthy, et al. . |
| 5,424,918 | * | 6/1995 | Felps et al. ............................ 361/704 |
| 5,428,897 | | 7/1995 | Jordan et al. . |
| 5,436,800 | | 7/1995 | Maruska et al. . |
| 5,442,234 | | 8/1995 | Liang . |
| 5,460,571 | | 10/1995 | Kato et al. . |
| 5,461,541 | | 10/1995 | Wentland, Jr. et al. . |
| 5,461,766 | | 10/1995 | Burward-Hoy . |
| 5,475,606 | | 12/1995 | Muyshondt et al. . |
| 5,487,673 | | 1/1996 | Hurtarte . |
| 5,502,622 | | 3/1996 | Cromwell . |
| 5,504,650 | | 4/1996 | Katsui et al. . |
| 5,506,758 | | 4/1996 | Cromwell . |
| 5,508,908 | | 4/1996 | Kazama et al. . |
| 5,513,070 | * | 4/1996 | Xie et al. . |
| 5,522,602 | | 6/1996 | Kaplo et al. . |
| 5,558,522 | | 9/1996 | Dent . |
| 5,579,827 | | 12/1996 | Chung . |
| 5,586,005 | | 12/1996 | Cipolla et al. . |
| 5,587,883 | | 12/1996 | Olson et al. . |
| 5,587,920 | | 12/1996 | Muyshondt et al. . |
| 5,592,366 | | 1/1997 | Goldman et al. . |
| 5,592,391 | | 1/1997 | Muyshondt et al. . |
| 5,598,320 | * | 1/1997 | Toedtman et al. . |
| 5,621,635 | * | 4/1997 | Takiar . |
| 5,628,636 | * | 5/1997 | Ollivier ................................. 439/70 |
| 5,640,304 | | 6/1997 | Hellinga et al. . |
| 5,641,995 | | 6/1997 | Sloma et al. . |
| 5,648,890 | * | 7/1997 | Loo et al. ............................ 361/704 |
| 5,722,839 | | 3/1998 | Yeh . |
| 5,730,620 | * | 3/1998 | Chan et al. ........................... 439/526 |
| 5,738,531 | * | 4/1998 | Beaman et al. ........................ 439/71 |
| 5,766,031 | | 6/1998 | Yeh . |
| 5,784,257 | * | 7/1998 | Tata ...................................... 361/704 |
| 5,808,236 | * | 9/1998 | Brezina et al. ...................... 174/16.3 |
| 5,880,930 | * | 3/1999 | Wheaton .............................. 361/690 |
| 5,917,703 | * | 6/1999 | Murthy ................................. 361/704 |
| 5,919,050 | * | 6/1999 | Kehley et al. ......................... 439/71 |

OTHER PUBLICATIONS

HP PDNO: 10970218, "A Heat Sink And Faraday Cage Assembly For A Semiconductor Module And a Power Converter." filed: Jul. 30, 1997, Ser. No. 08/902,770, pp. 1–17, Figs. 1–6.

HP PDNO: 10970583–1, "Perimeter Clamp For Mounting and Aligning a Semiconductor Component As Part Of a Field Replaceable Unit (FRUI)," filed Feb. 27, 1998, Ser. No. 09/032,359, pp. 1–27, Figs. 1–5.

HP PDNO: 10971840–1, "Method And Apparatus For A ModularIntegrated Apparatus For Multi–Function Components." filed: Oct. 29, 1998, Ser. No. 182939, pp. 1–35, Figs. 1–4.

"Chomerics—The EMI Shielding/Thermal Resource Center," (visited Oct. 29, 1998) <http://www.chomerics.com>.

MASCO Electronics—Spira, "InspirationThe Better EMI Gasket,"(visited Oct. 29, 1998) <http://www.masco–electronics.com/spira.shtm> p. 1 of 2.

"Thermstrate High Efficiency Thermal," (visited Nov. 9, 1998), <http://www.powerdevices.com> pp. 1–2.

Texas Instruments (visited Nov. 6, 1998), <http://www.ti.co./mc/docs/igb/docs/lga.htm> p. 1.

Thomas & Betts Corporation (visited Nov. 6, 1998), <http://www.businesswire.com/cnn/tnb.htm> pp. 1–3.

HP PDNO: 10971839–1, "Methods And Apparatus For A Modular Integrated Apparatus For Heat Dissipation, Processor Integration, Electrical Interface, And Electromagnetic Interference Management." filed: Nov. 18, 1998, Ser. No. 09/195,256, pp. 1–27, Figs. 1–9.

HP PDNO: 10970383–1, "Apparatus And Method For Precise Alignment Of A Ceramic Module To a Test Apparatus." pp. 1–9.

"Chomerics at Wireless Design Online," (visited Jan. 7, 1999) <http://www.wirelessdesignonline.com/storefronts/contact/chomerics/htm>pp. 1–2.

"THIXOTECH—World Leadership in Thixomolding." (visited Dec. 21, 1998) <http;//www.thixotech.com/thixohome.htm>p. 1.

"Chomerics Basics—Heat Transfer Fundamentals." (visited Dec. 18, 1998). <http://www.chomerics.com/thermal.html>pp. 1–4.

"Cho–Form . . . Automated Form–In–Place EMI Gasketing Technology," Chomerics Division, Parker Hannifin Corp. Sep. 1998. pp. 1–12.

"Chomerics Products/Services." (visted Dec. 18, 1998) <http://www.chomerics.com/cfbro.html>pp. 1–4.

"Chomerics: Cho–Therm Thermal Interface Materials." Technical Bulletin #42 (1997). Chomerics Division of Parker Hannifin Corp. Woburn, MA. pp. 1–2.

* cited by examiner

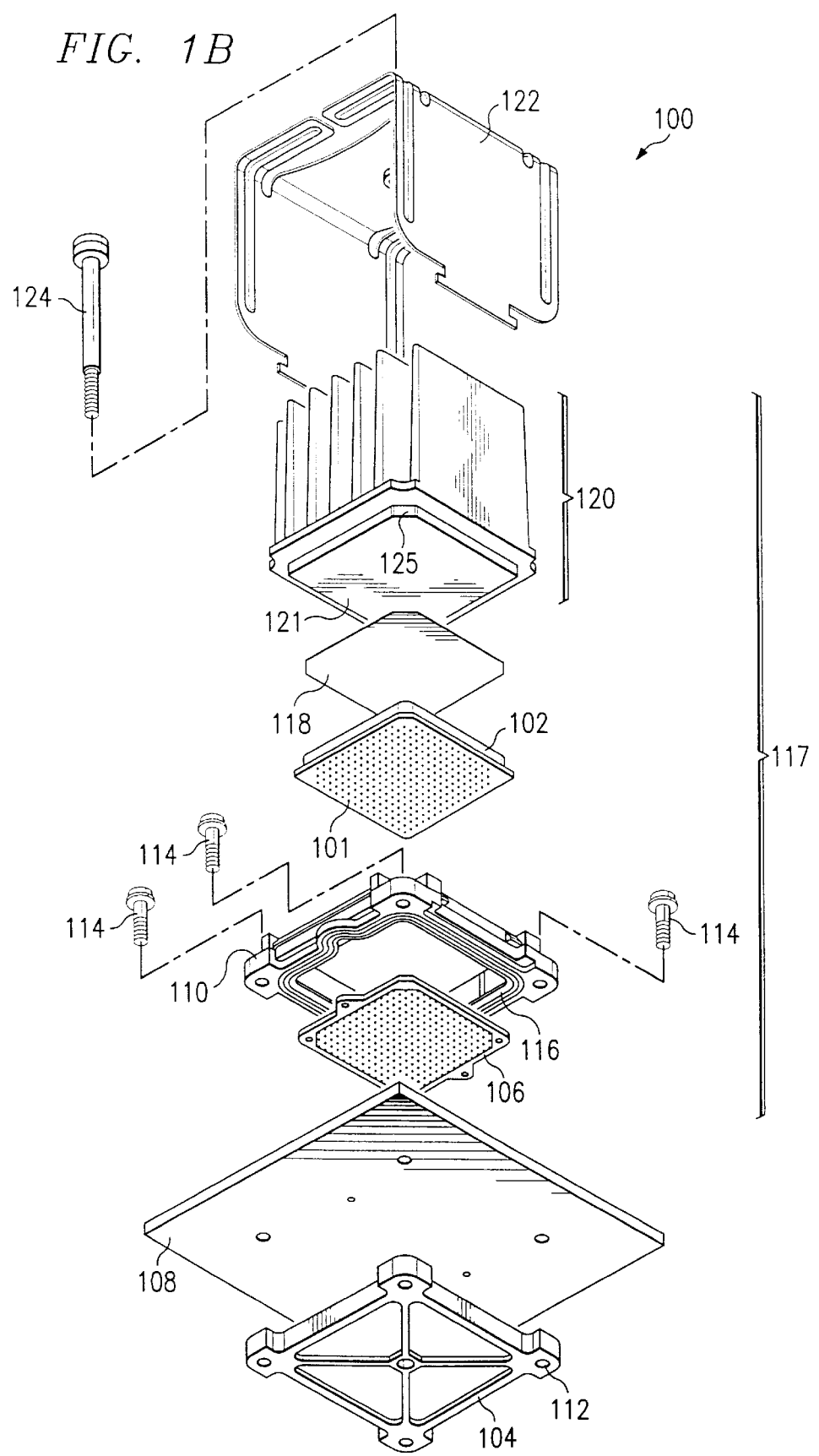

METHOD AND APPARATUS FOR ELECTRICAL AND MECHANICAL ATTACHMENT, AND ELECTROMAGNETIC INTERFERENCE AND THERMAL MANAGEMENT OF HIGH SPEED, HIGH DENSITY VLSI MODULES

FIELD OF THE INVENTION

The present invention relates generally to a method and apparatus for integrated circuit assembly. More particularly, the present invention relates to a method and apparatus for assembling a high speed, high density VLSI module that enables attachment, support, electromagnetic interference containment, and thermal management of the VLSI module.

1. Description of Related Art

The following applications are related to the present application, U.S. patent application entitled "METHOD AND APPARATUS FOR A MODULAR INTEGRATED APPARATUS FOR HEAT DISSIPATION, PROCESSOR INTEGRATION, ELECTRICAL INTERFACE, AND ELECTROMAGNETIC INTERFERENCE MANAGEMENT," Ser. No. 09/195256, naming inventor S. Daniel Cromwell, et al., assigned to the assignee of the present invention; and U.S. Patent Application entitled "METHOD AND APPARATUS FOR PRECISE ALIGNMENT OF A CERAMIC MODULE TO A TEST APPARATUS," Ser. No. 08/898327, naming inventors Rajendra D. Pendse, et al., assigned to the assignee of the present invention.

2. Background of the Invention

The use of increasingly high speed very large scale integrated circuit (VLSI) modules in computer systems has given rise to new assembly challenges related to their attachment, support, electromagnetic interference containment, and thermal management. For example high speed VLSI modules have input/output counts of 2000.

Often, due to the large thermally induced stresses that impact the long term reliability of solder joints, these high speed, high density VLSI module assemblies cannot employ standard solder techniques for connecting the VLSI modules to a circuit board. Therefore, there has been the emergence of interposer socket assembly techniques including a land grid array configuration of a VLSI module.

Another problem with high density, high speed VLSI modules is the difficulty of aligning the circuit board and an interposer socket assembly, and aligning the interposer socket assembly and the VLSI module. That is, as the pitch of a land grid array is reduced, the alignment becomes more difficult. It will be appreciated that the "pitch" of a land grid array refers to the distance from pad to pad, and that a "pad" refers to the individual contacts or connections in an interposer configuration.

Further, assembly space for high speed VLSI modules is limited. Also, high speed VLSI modules emit electromagnetic interference and heat that requires management. Therefore an efficient, high speed VLSI assembly should also include a tight Faraday Cage and a high performance heat dissipation device in the same package.

Further, improvements in high speed VLSI assemblies have been hindered by the difficulty of upgrading and handling of the VLSI module outside of a manufacturing or assembly environment.

Also, the difficulty of scaling high speed VLSI assemblies to large or small configurations has hindered improvements in high speed, high density VLSI module assembly.

SUMMARY OF THE INVENTION

The present invention is a method and apparatus for assembling a high speed, high density VLSI module in a computer system that enables attachment, support, electromagnetic interference containment, and thermal management of the VLSI module.

Accordingly it is an object of the invention to package a high speed, high density VLSI module within a limited space and in a single assembly that attaches, aligns, and manages electromagnetic interference and heat dissipation of the VLSI module, thereby efficiently using minimal space for the VLSI module assembly.

The VLSI module may include any general purpose application specific integrated circuit (ASIC) such as an area grid array or a socket-based VLSI module. However, as the I/O count has increased the ASIC package size has become too large for solder-attachment techniques and presents special problems that are solved by the present invention. Therefore, it is another object of the invention to align a land grid array of a circuit board and an interposer socket assembly, and to align the interposer socket assembly and a land grid array of the VLSI module in the single VLSI module assembly.

It is also an object of the invention to enable an alignment mechanism for the interposer socket assembly that is easy to manufacture and that supports tight tolerances that are required between the interposer socket assembly and the VLSI module. Therefore, the present embodiment employs the use of a solder ball and socket configuration between the VLSI module and the interposer socket assembly to manage the tight tolerance and close alignment requirements of the VLSI module.

It is also an object of the invention to enable ease-of-use in upgrading and handling of the VLSI module. For example in the present embodiment, due to the management of the alignment and orientation of the elements of the VLSI module assembly it is difficult to assemble the elements incorrectly.

It is another object of the invention to ensure that an even, controlled load is placed on the interposer socket interface thereby reducing the risk of damage to the interposer socket from overloaded connections between the land grid array of the VLSI module, the interposer socket assembly, and the land grid array of the circuit board. For instance the present embodiment may include the use of an overhead clamp and a single heat sink screw for a single load point that ensures an even load on the VLSI module. That is, by pressure from the overhead load clamp, the single heat sink screw applies load to a heat sink that is connected to the VLSI module. Therefore even loading may be accomplished by reusing the heat sink as a load spreader. It will be appreciated that the term "connect" refers to an element being held in proximity to another element while not bolting the elements together.

It is yet another object of the present invention to enable scaling of the VLSI module assembly to large or small configurations. For instance, the present invention novelly employs the overhead clamp that may be configured for large or small VLSI assemblies while maintaining an even load on the VLSI module.

It is another object of the invention to include a heat dissipation device in the VLSI module assembly. Therefore, the present embodiment includes a heat sink having heat fins and a heat sink base. The heat sink base is in optimal thermal proximity to the VLSI module to absorb heat, and to transfer the heat to the heat fins for efficient heat dissipation.

It is another object of the invention to integrate a Faraday Cage in the VLSI module assembly. Therefore, the present embodiment includes a Faraday Cage having the circuit board, an electromagnetic interference frame including a compliant electrically conductive electromagnetic interference gasket, and the heat sink base.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1B is a bottom, perspective view that illustrates the VLSI module assembly;

DETAILED DESCRIPTION

Figure 1A:
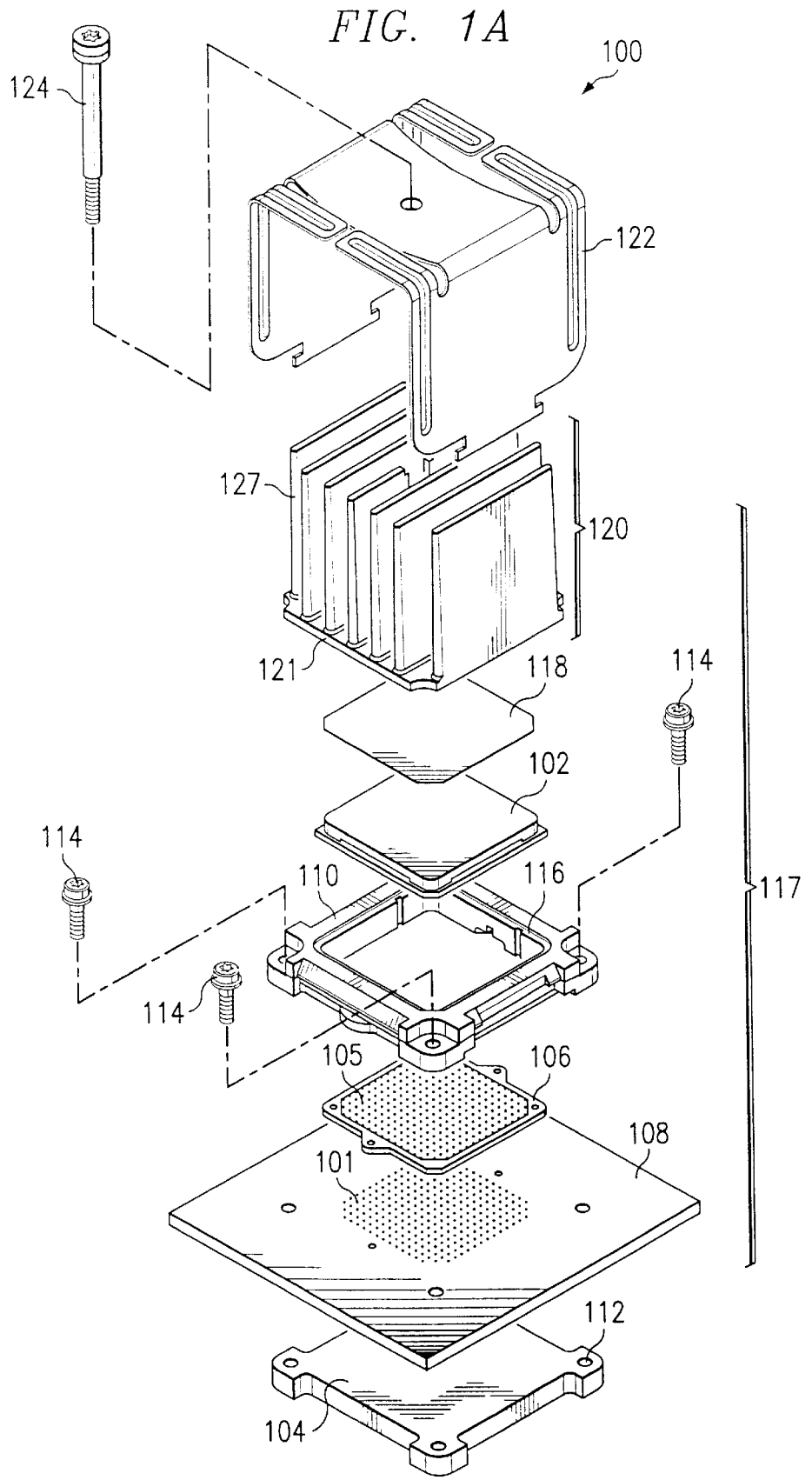
FIG. 1A is a top, perspective view that illustrates the VLSI module assembly.

In the following detailed description and in the several figures of the drawings, like elements are identified with like reference numerals.

Broadly stated, FIG. 1A illustrates a top, exploded, perspective view of the VLSI module assembly 100 that enables attachment, support, electromagnetic interference containment, and thermal management of the VLSI module 102.

The embodiment includes a circuit board 108 that is electrically connected to the VLSI module 102. A bolster plate 104 is also included that supports a circuit board 108 thereby supporting the load that is placed on an interposer socket assembly 106. The interposer socket assembly 106 requires careful load management and alignment of the connections between the interposer socket assembly 106 and a land grid array 101 (as shown in FIG. 1B) of the VLSI module 102, and between the interposer socket assembly 106 and the land grid array 101 of the circuit board 108.

The circuit board 108 may be sandwiched between the bolster plate 104 and an electromagnetic interference frame 110. The bolster plate 104 may be attached to the circuit board 108 by bolster screws 114 that fit into the electromagnetic interference frame 110, that pass through the circuit board 108, and that terminate in bolster sockets 112 in the bolster plate 104. In the present embodiment, the electromagnetic interference frame 110 circumscribes the VLSI module 102 and attenuates electromagnetic interference generated by the VLSI module 102. That is, in the present embodiment the electromagnetic interference frame 110 surrounds the VLSI module 102 and includes electrically conductive material thereby attenuating electromagnetic interference from the VLSI module 102.

Figure 4A:
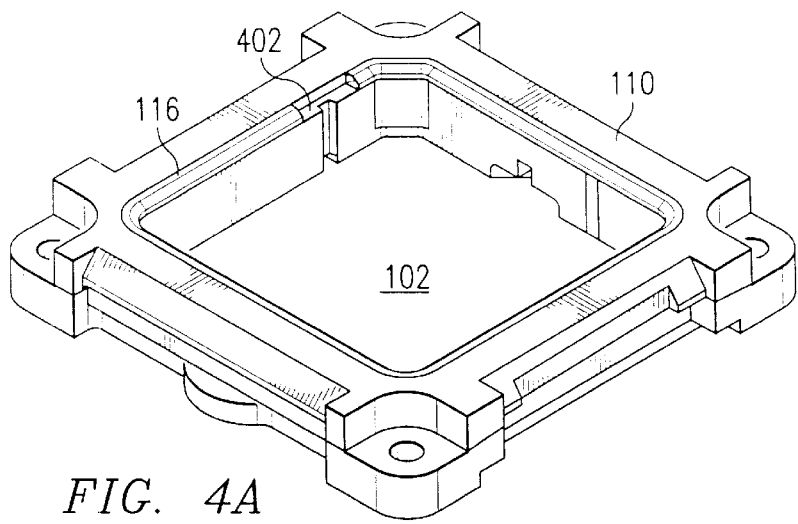
FIG. 4A is a top view that illustrates the electromagnetic interference frame.
Figure 4B:
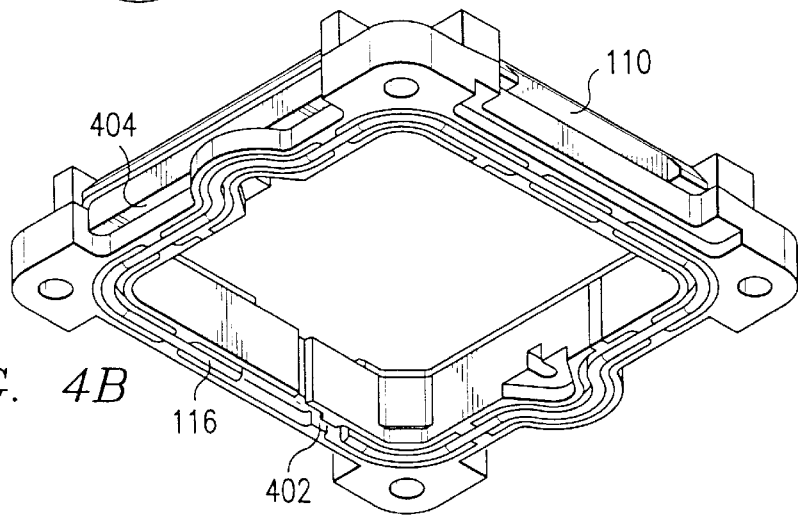
FIG. 4B is a bottom view that illustrates the electromagnetic interference frame.

Further in the present embodiment a Faraday Cage 117 is created by the electromagnetic interference frame 110, the circuit board 108, a heat sink base 121, and an electromagnetic interference gasket 116 sandwiched between the circuit board 108 and the electromagnetic interference frame 110 (as shown in FIG. 1B) and between the electromagnetic interference frame 110 and the heat sink base 121. Therefore, the electromagnetic interference gasket 116 seals the Faraday Cage 117 at the junctions of the electromagnetic interference frame 110 thereby attenuating electromagnetic interference from the VLSI module 102. Further, the electromagnetic interference gasket 116 may be molded into electromagnetic interference grooves 402 (as shown in FIGS. 4A and 4B) to minimize gaps in the seal it creates. Further, the electromagnetic interference frame 110 aligns and orients the VLSI module 102 so that it is properly assembled and may be used as an alignment frame.

It will be appreciated that the VLSI module 102 may be a multi-chip module or a single VLSI module 102. For instance the VLSI module 102 may be a flip-chip assembly. Typically a land grid array may implement a compression assembly technique in which the interposer socket assembly 106 is sandwiched between the land grid array 101 of the VLSI module 102 and the land grid array 101 of the circuit board 108. As will be appreciated by those skilled in the art, interposer technologies provide a reliable, low inductance, low resistance electrical connection between the land grid array 101 of the circuit board 108 and of the VLSI module 102. The interposer socket assembly 106 requires an even load distribution to ensure even loading and pressure on the contacts of the land grid array 101 of the circuit board 108 and of the VLSI module 102. It will be appreciated that even load distribution will minimize damage to the contacts on the interposer socket assembly 106 by overloading and possible short circuiting of the electrical connections between the VLSI module 102, the interposer socket assembly 106, and the circuit board 108. Reference herein to a circuit board 108 may include a printed circuit board such as a mother board.

The bolster plate 104 may be made of metal and may be laminated with an insulating material (not shown) such as mylar to protect from electrical shorts on contact with the circuit board 108. The pad 105 of the interposer socket assembly 106 connects to the land grid array 101 of the VLSI module 102 and to the land grid array 101 of the circuit board 108.

Figure 2A:
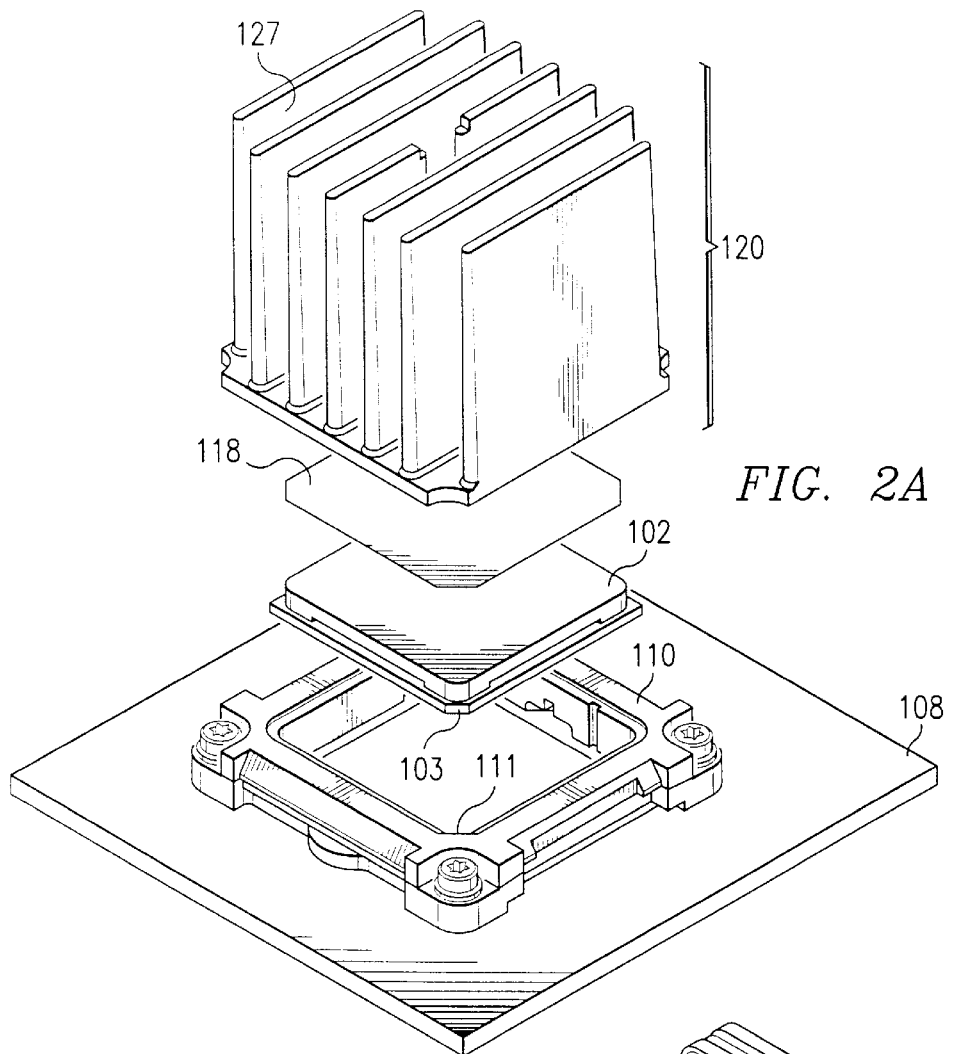
FIG. 2A is a perspective view that illustrates the assembly of the heat sink and the VLSI module.

The present invention manages the load imposed by the connection of the heat sink 120 to the VLSI module 102. That is, the heat sink base 121 operates as a load spreader. A single heat sink screw 124, that is centrally located relative to the heat sink base 121, transfers load to a heat sink well 123 (as shown in FIG. 2E) in the heat sink base 121. By tightening the heat sink screw 124, the load from the overhead clamp 122 is transferred to the heat sink base 121 which spreads the load in a controlled and even fashion to the VLSI module 102, and the pads 105 on the interposer socket assembly 106.

In the present embodiment the heat sink 120 includes the heat sink base 121 that is thermally connected to the VLSI module 102, and heat fins 127 that divert heat from the VLSI module 102 by moving heat to a space where there is sufficient air flow to cool the system. Further, an optional thermal pad 118 may be sandwiched between the heat sink 120 and the VLSI module 102 to enhance the thermal interface and thereby improve heat dissipation. Therefore, the heat sink 120 is reused as a load plate and an element of the Faraday Cage 117 in addition to managing heat dissipation.

In the present embodiment, the overhead clamp 122 is a heat-treated steel spring that straddles the heat sink 120 and latches on two sides of the electromagnetic interference frame 110 to enable quick and easy assembly or replacement of the VLSI module 102. Further, tightening the heat sink screw 124 straightens the overhead clamp 122 and ensures a tight fit of the overhead clamp 122 to the electromagnetic interference frame 110. By tightening the centrally located heat sink screw 124 and evenly spreading the load through the heat sink base 121, the load is transferred to the VLSI module 102. Therefore, the VLSI module 102 is compressed on the interposer socket assembly 106 and completes the electrical connection between the land grid array 101 of the VLSI module 102 and the interposer socket assembly 106, and between the interposer socket assembly 106 and the land grid array 101 of the circuit board 108. By adjusting the overhead clamp 122 and heat sink screw 124 length, the load can be managed as required. Therefore, the overhead clamp 122 significantly improves a typical four corner attach point process by maintaining even loading while the heat sink screw 124 is tightened. Compared to previous techniques that include tedious multiple-pass cross pattern tightening to evenly load and unload the VLSI module 102 the present embodiment enables more efficient loading of the VLSI module 102.

FIG. 1B illustrates a bottom, exploded, perspective view of the VLSI module assembly 100 that includes the circuit board 108 that is attached to the bolster plate 104. The bolster sockets 112 on the bolster plate 104 are the terminus for the bolster screws 114 that fit into the electromagnetic interference frame 110.

Both the top (as shown in FIG. 1A) and bottom of the electromagnetic interference frame 110 are interfaced with the electromagnetic interference gasket 116 to form a seal for the Faraday Cage 117. The electromagnetic interference gasket 116 may be made of metal impregnated, silicon-based polymer, that enables an efficient electrical conduction, such as a product marketed under the trademark CHO-SEAL™ which is injection molded over the electromagnetic interference frame 110 in grooves or seats for such purpose.

The VLSI module 102 is aligned and oriented for proper positioning with respect to the interposer socket assembly 106. The VLSI module 102 includes the land grid array 101. Further the heat sink 120 and the heat sink base 121 are also aligned and oriented for proper positioning with respect to the VLSI module 102. In the present embodiment, the heat sink base 121 is a pedestal that optimally connects to the VLSI module 102 to enable thermal coupling of the heat sink 120 to the VLSI module 102 with a sufficiently low resistance thermal path. In the present embodiment, the heat sink base 121 includes a chamfered heat sink corner 125 that interfaces to a frame chamfered corner 111 (as shown in FIG. 2A) on the electromagnetic interference frame 110 that ensures proper assembly and orientation between the heat sink 120 and the electromagnetic interference frame 110. The optional thermal pad 118 may be sandwiched between the heat sink 120 and the VLSI module 102.

Finally in the present embodiment, the overhead clamp 122 fits over the heat sink 120 and attaches on two sides of the perimeter of the electromagnetic interference frame 110. The heat sink screw 124 is inserted into the overhead clamp 122 and sits in the heat sink well 123 (as shown in FIG. 2E).

FIG. 2A illustrates the assembly of the heat sink 120 and the VLSI module 102 with respect to the electromagnetic interference frame 110 that has been attached to the circuit board 108. The optional thermal pad 118 may be sandwiched between the heat sink 120 and the VLSI module 102. That is, the thermal pad 118 is held in place by squeezing it between the heat sink 120 and the VLSI module 102. Use of the thermal pad 118 is especially advantageous to enhance the thermal communication between the VLSI module 102 and the heat sink 120.

The heat sink 120, the bolster plate 104 (as shown in FIG. 1A), and the electromagnetic interference frame 110, which all may be made of metal and may be manufactured by any appropriate technique, such as the technique marketed under the trademark THIXOMOLDING®. Such a molding technique produces a part with little or no post-machining required thereby reducing manufacturing cost. For example, the following features of the heat sink 120 may be molded without post-machining: the heat sink base 121 (as shown in FIG. 1A), the heat fins 127, the heat sink well 123 (as shown in FIG. 2E), and the extreme flatness required on the bottom of the heat sink base 121. Additionally, the detail and function of the electromagnetic interference frame 110 is molded in without machining. It will be appreciated that producing a very flat surface on the bottom of the heat sink base 121 may eliminate the requirement for the thermal pad 118. That is, since the flat molded surface enables a sufficient thermal interface between the VLSI module 102 and the heat sink base 121 use of the thermal pad 118 is optional. Further, the even load on the heat sink base 121 that is transferred to the interposer socket assembly 106 is enhanced by a flat surface connection between the heat sink base 121 and the VLSI module 102. Since the substrate of the VLSI module 102 may be made of ceramic material and is therefore subject to cracking due to strain induced in a non-uniform load distribution, an even, flat surface connection is also advantageous to minimize damage due to cracked ceramic material. Those skilled in the art will appreciate the use of a substrate.

Figure 5:
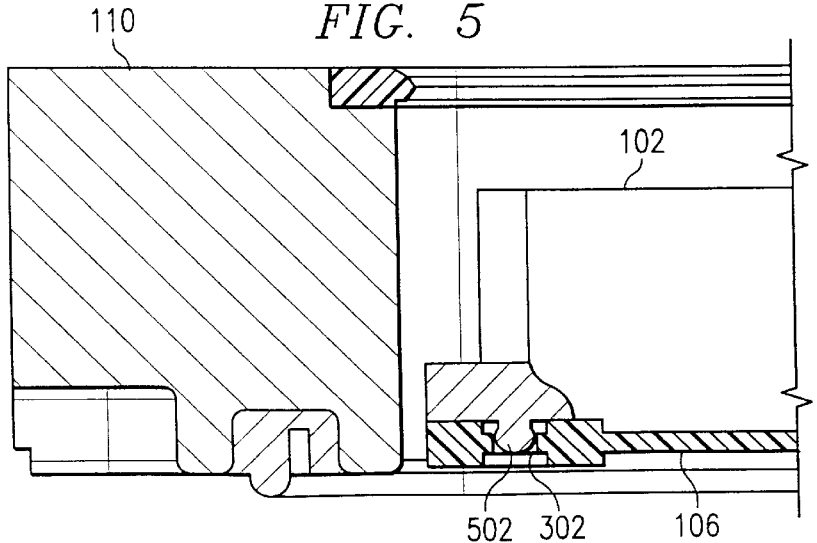
FIG. 5 is a side view that illustrates the alignment ball that fits into the interposer socket assembly.

The VLSI module 102 includes a VLSI module chamfered corner 103 that fits into the frame chamfered corner 111 and matches the shape of the heat sink base 121 thereby orienting the assembly of the VLSI module 102 in the electromagnetic interference frame 110. Also the position of the electromagnetic interference frame 110 pre-positions the VLSI module 102 above the interposer socket assembly 106 (as shown in FIG. 1A) so that the VLSI module 102 will easily find its final position with respect to the interposer socket assembly 106 and the circuit board 108. In the present embodiment alignment balls 502 (as shown in FIG. 5) attached to the VLSI module 102 interface into sockets in the interposer socket assembly 110 (as are discussed with respect to FIG. 3A) to facilitate positioning of the VLSI module 102 with regard to the interposer socket assembly 106.

Figure 2B:
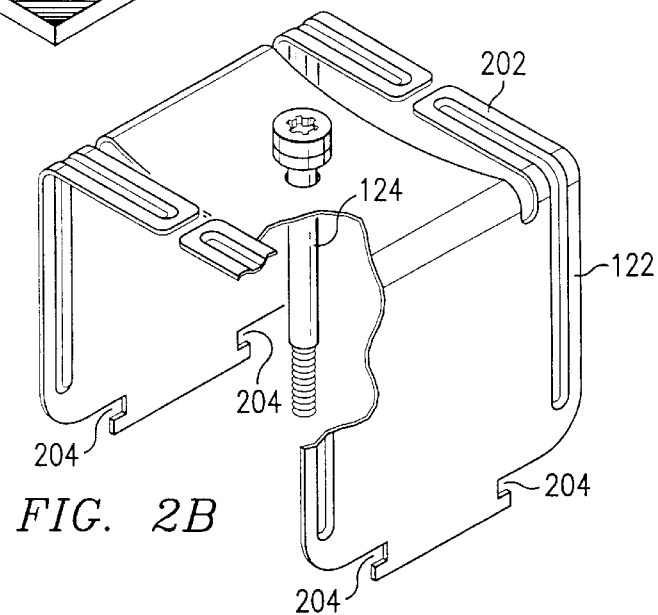
FIG. 2B illustrates the overhead clamp assembly along with the heat sink screw.

As shown in FIG. 2B, the overhead clamp 122 is bowed prior to being tightened by the heat sink screw 124, thus functioning as a spring. The overhead clamp 122 is a spring and when the clamp edges 202 are depressed the bottom edges of the overhead clamp 122 are spread, thus enabling insertion and removal of the overhead clamp 122 of the attachment to the electromagnetic interference frame 110. In the present embodiment the clamp edges 202 are separated from the center of the overhead clamp 122 and are straight as depicted in FIG. 2B. It will be appreciated that the clamp edges 202 may function as handles to enable ease-of-use for manipulating the overhead clamp 122 during installation and removal.

Figure 2C:
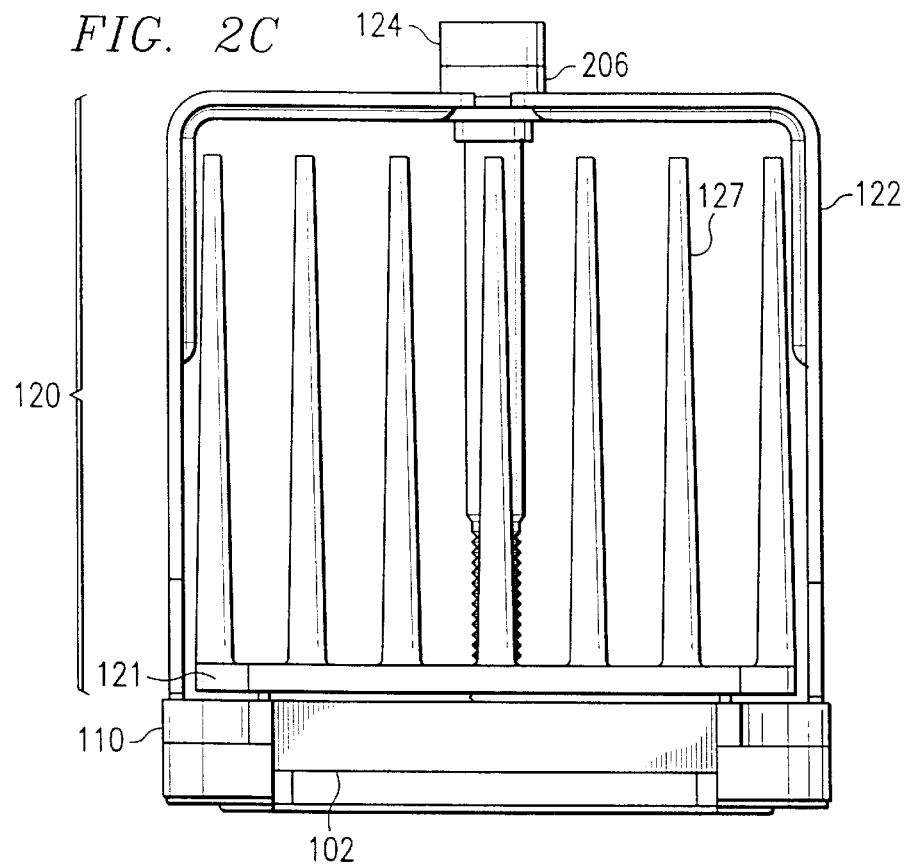
FIG. 2C is a side view that illustrates the overhead clamp and the heat sink screw.

As shown in FIG. 2C, when the heat sink screw 124 is tightened the overhead clamp 122 is unbent thereby loading the heat sink 120 through pressure from the heat sink screw 124. Therefore the VLSI module 102 will bear the load from the heat sink base 121 and little load is borne on the electromagnetic interference frame 110. It will be appreciated that in the present embodiment, the heat sink base 121 is formed in the shape of a pedestal that creates a gap between the heat sink 120 and the electromagnetic interference frame 110. Therefore, the load created by the tightened heat sink screw 124 and the heat sink 120 does not rest on the electromagnetic interference frame 110. The heat sink screw 124 may include a washer 206 to ensure that a fully formed thread (not shown) on the heat sink screw 124 bears the load as it interfaces with the threads (not shown) on the overhead clamp 122. Also, the washer 206 enables adjustment of the load on the overhead clamp 122 by changing the height of the heat sink screw 124. It will be appreciated that when the heat sink screw 124 is fully set, variability in the load is separated from the assembly process and is a function of the tolerance of the components.

The position of the overhead clamp 122 with respect to the heat fins 127 may be oriented to ensure maximum air flow through the heat sink 120, especially when the computer system includes a fan (not shown) that directs the flow of air.

Figure 2D:
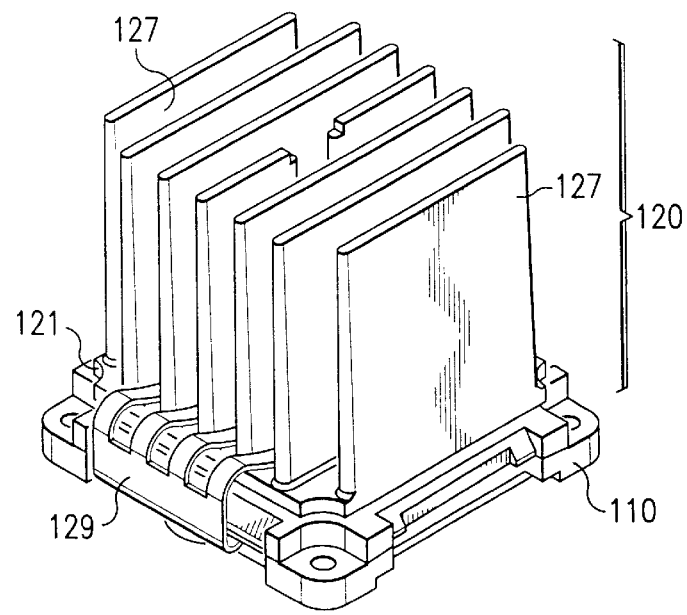
FIG. 2D is a perspective view that illustrates an alternative embodiment of the overhead clamp.
Figure 2E:
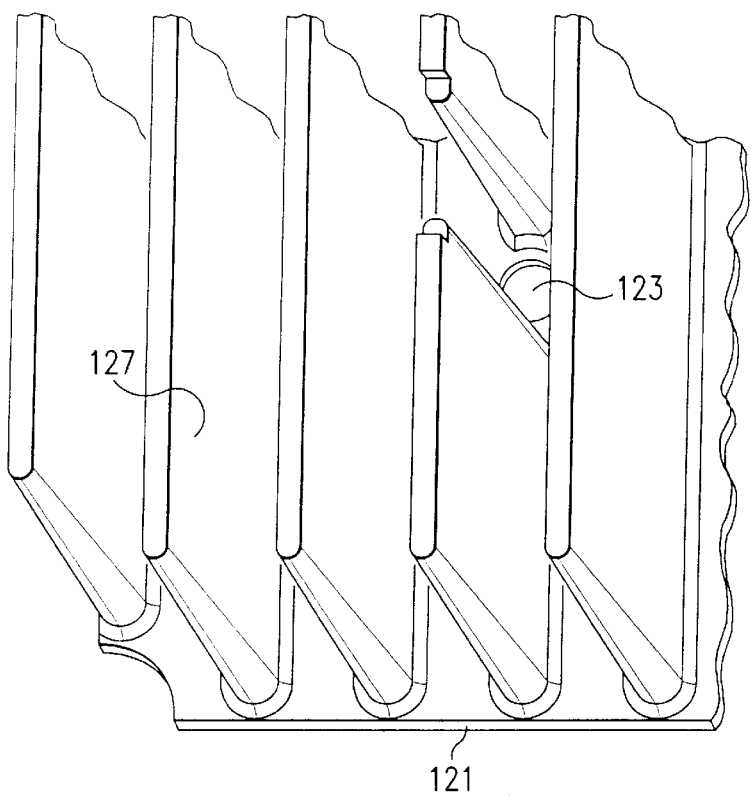
FIG. 2E illustrates the heat fins, the heat sink well, and the heat sink base.

FIG. 2D is a perspective view that illustrates an alternative embodiment of the overhead clamp 129 that may enable the use of a VLSI module 102 that is soldered to the circuit board 108 (as are shown in FIG. 1A). In the present embodiment the alternate clamp 129 fits over the heat fins 127 and includes slots (not shown) into which the heat fins 127 are inserted. The alternate clamp 129, the electromagnetic interference frame 110, and the heat sink 120 are preassembled before attachment to the printed circuit board 108 (as are shown in FIG. 1A). The electromagnetic interference frame 110 is oriented and aligned by its interface with the VLSI module 102. When the electromagnetic interference frame 110 is attached to the printed circuit board 108 the alternate clamp 129 delivers load to the heat sink base 121 to ensure an optimal thermal interface. The alternate clamp 129 may be snapped off and on the electromagnetic interference frame 110. The electromagnetic interference frame 110 may include receiving features for both the alternate clamp 129 and the overhead clamp 122 (as shown in FIG. 2C). The solder-based VLSI module 102 may be attached to the circuit board 108 without orientation management, enabling this cost efficient solution. This alternate embodiment does not require field upgrade of the VLSI module 102. It will be appreciated that the bolster plate 104 (as shown in FIG. 1) may be optional if a solder-based VLSI module 102 is used since less force is applied to attach the VLSI module 102 to the circuit board 108 by the alternate clamp 129.

The present embodiment, therefore, allows computer system development with socketed VLSI modules 102 during the early stages of development and efficiently supports conversion to solder-attached VLSI modules 102 in the later stages of development and in manufacturing by reusing the same electromagnetic interference frame 110 and heat sink 120. Therefore, the present embodiment enables flexible assembly of VLSI modules 102 that may be permanently assembled or may support insertion and removal in the field. The alternate clamp 129 may be the only part that changes.

As shown in FIG. 2E, in the present embodiment a heat fin 127 is separated and the heat sink well 123 is centrally located in the heat sink base 121. In the present embodiment the heat sink well 123 is a depression in the heat sink base 121 that is the terminus point for the heat sink screw 124 (as shown in FIG. 1A). Recall that the heat sink screw 124 is inserted into the overhead clamp 122 (as shown in FIG. 1A) and sits in the heat sink well 123. By advantageously integrating the heat sink well 123 into the heat sink base 121 it will be appreciated that the load from the heat sink screw 124 is transferred to the heat sink base 121 thereby reusing the heat sink base 121 as a load spreader.

More particularly in the present embodiment, the heat sink well 123 is a small counter bore in the center of the heat sink base 121 that provides a seat for the heat sink screw 124. The heat sink well 123 keeps the heat sink screw 124 centered and positioned. The heat sink screw 124 includes a spherical end (not shown) to minimize moment loads to the heat sink 120 (as shown in FIG. 1A) and to minimize metal debris from use. It will be appreciated that metal debris may impair the functioning of the VLSI module 102 by creating extraneous electrical contacts between the VLSI module 102 and the interposer socket assembly 106 (as are shown in FIG. 1A).

Figure 2F:
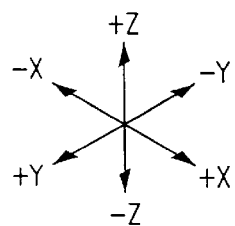
FIG. 2F illustrates the VLSI module assembly.
Figure 2F:
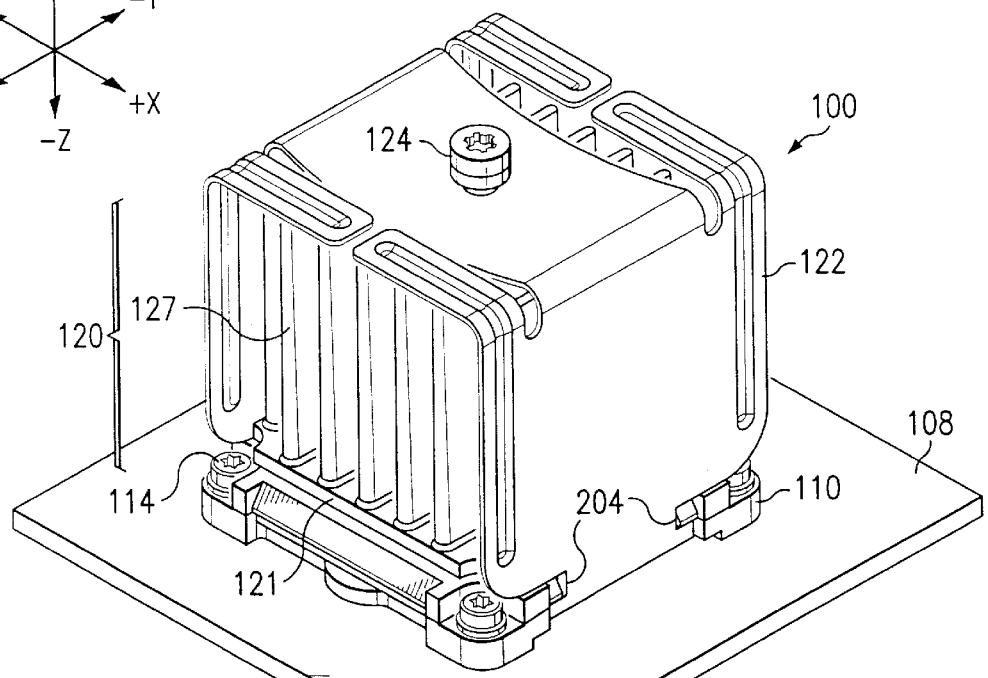

FIG. 2F illustrates the VLSI module assembly 100 after assembly, and includes the circuit board 108, the electromagnetic interference frame 110 that is attached to the circuit board 108 by the bolster screws 114. In the present embodiment, the overhead clamp 122 is snapped into two sides of the electromagnetic interference frame 110 by clamp notches 204 in the bottom edges of the overhead clamp 122. The heat sink 120 includes the heat fins 127 and the heat sink base 121. The overhead clamp 122 is connected to the heat sink 120 by the heat sink screw 124.

It will be appreciated that the position and orientation of the heat sink 120 is tightly constrained to ensure even load transfer from the heat sink 120 to the VLSI module 102. Therefore, both rotational and translational movement is constrained in the X, Y, and Z directions. The heat sink is rotationally constrained in the Z direction by the electromagnetic interference frame 110, and in the X and Y directions by the circuit board 108. The heat sink 120 is translationally constrained by the electromagnetic interference frame 110 in the X and Y directions, by the circuit board 108 in the minus Z direction, and by the heat sink screw 124 in the positive Z direction. It will be appreciated that translational movement refers to the movement within a plane and rotational movement refers to rotation about an X, Y, or Z axis.

Figure 3A:
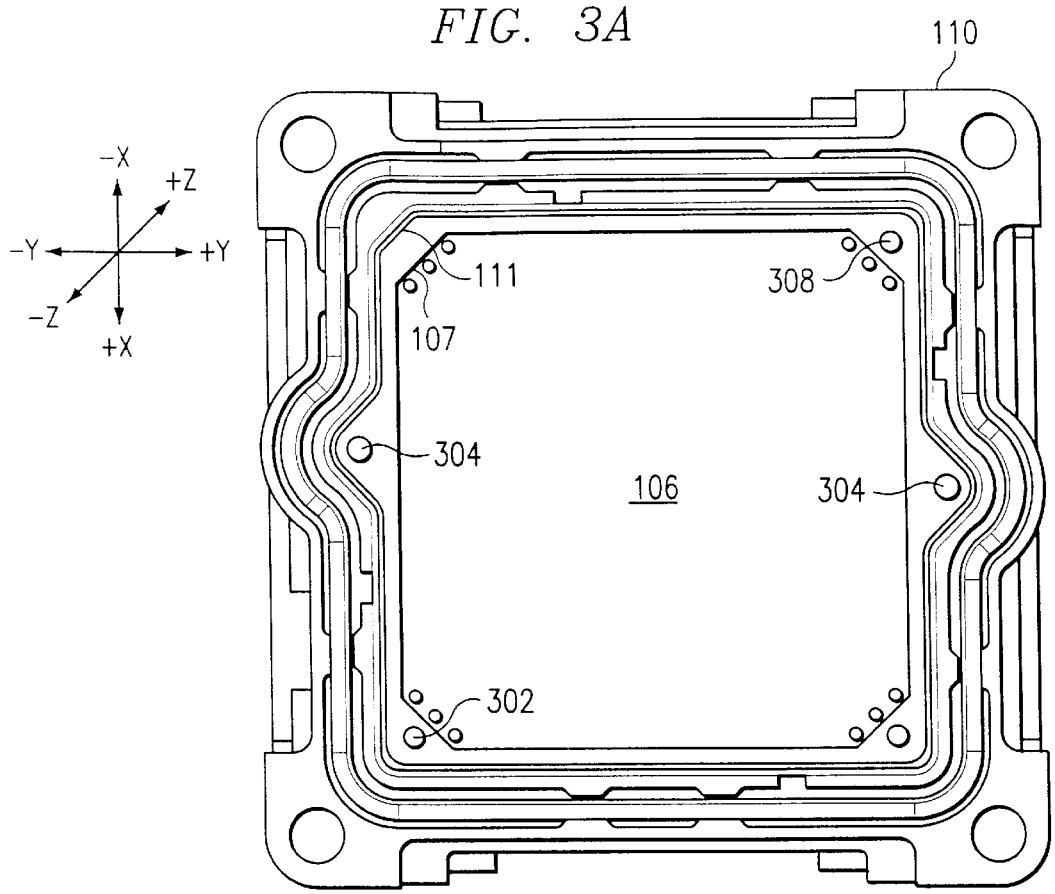
FIG. 3A is a bottom view that illustrates the electromagnetic interference frame and the interposer socket assembly.

FIG. 3A illustrates a bottom view of the electromagnetic interference frame 110 and the interposer socket assembly 106. The distance between the electromagnetic interference frame 110 and the interposer socket assembly 106 is tightly constrained. By this tight fit, the landing zone of the alignment socket 302 relative to the alignment balls 502 (as shown in FIG. 5) that are attached to the VLSI module 102 (as shown in FIG. 1A), is constrained thereby ensuring a proper placement of the interposer socket assembly 110 with respect to the land grid array 101 of the VLSI module 102. The alignment socket 302 is diagonally opposite an oblong alignment socket 308. This ensures an accurate fit of the VLSI module 102 in the interposer socket assembly 106. Further, the tight positioning of the interposer socket assembly 106 ensures proper orientation and positioning of the electromagnetic interference frame 110, which ensures proper orientation and prealignment of the VLSI module 102.

Movement of the VLSI module 102 is constrained by the alignment socket 302 and the oblong alignment socket 308 which bound the translational movement in the X and Y direction. Rotational movement of the VLSI module 102 about the Z axis is constrained by the oblong alignment socket 308 on the interposer socket assembly 106. Further, translational movement of the VLSI module 102 in the Z direction is constrained by gravity and the overhead clamp 122 (as shown in FIG. 1A). Additionally the circuit board 108 (as shown in FIG. 1A) constrains rotational movement of the VLSI module 102 about the X and Y direction.

The shape of the electromagnetic interference frame 110 includes space for alignment pins 304 that are asymmetrically located, with respect to each other, on the interposer socket assembly 106. By advantageously asymmetrically positioning the alignment pins 304, and by including an interposer chamfered corner 107 on the interposer socket assembly 106 and the frame chamfered corner 111 on the electromagnetic interference frame 110, the interposer socket assembly 106 may be fully assembled only in its proper orientation to the printed circuit board 108. The shape of the interposer socket assembly 110, as depicted in FIG. 3A allows room for alignment pins 304 without sacrificing any connections on the VLSI module 102.

Figure 3B:
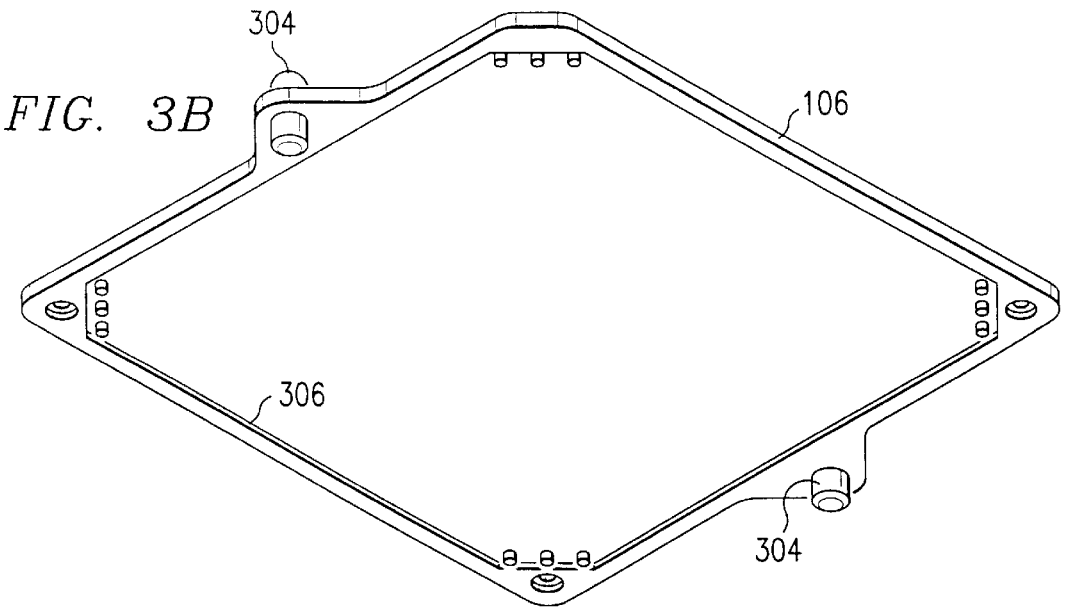
FIG. 3B illustrates the interposer socket assembly.

FIG. 3B illustrates the interposer socket assembly 106 that is oriented and aligned with respect to the land grid array 101 of the VLSI module 102 (as are shown in FIG. 1B) and the land grid an-ay 101 of the circuit board 108 (as are shown in FIG. 1A). In the present embodiment there are two alignment pins 304 that are part of the interposer socket assembly 106 and whose size and location are precise to ensure that they fit into circuit board sockets (not shown), thereby ensuring the proper position of the interposer socket assembly 106 with respect to the circuit board 108. This precise positioning of the alignment pins 304 ensures proper electrical contacts are made between the interposer socket assembly 106 and the circuit board 108.

The space required by the interposer socket assembly 106 may be the same as that of the VLSI module 102 except for the area used by the two alignment pins 304. This nearly zero additional space feature enables a minimum space requirement for the interposer socket assembly 106 and allows for close positioning of the VLSI module 102 to other components of the computer system.

In the present embodiment the interposer socket assembly 110 includes a deflection limiter 306 that is shelf shaped and that circumscribes the interposer socket assembly 110. The deflection limiter 306 ensures that the pads 105 of the interposer socket assembly 110 will not be damaged by over deflection from the load. By bearing any additional load, the deflection limiter 306 controls the maximum deflection of the pads 105 of the interposer socket assembly 110 on both sides.

To enable replacement in the field of the VLSI module 102 the interposer socket assembly 110 is reusable. That is, the VLSI module 102 may be changed without requiring replacement of the original interposer socket assembly 110.

FIG. 4A illustrates the top side of the electromagnetic interference frame 110. More particularly, electromagnetic interference from the VLSI module 102 is also attenuated by the electromagnetic interference gasket 116 that may be made of a compliant metalized polymer and that may be molded into the electromagnetic interference groove 402 in the top of the electromagnetic interference frame 110. The electromagnetic interference gasket 116 contacts the perimeter of the heat sink base 121 thereby creating a seal for the Faraday Cage 117 (as are shown in FIG. 1A).

FIG. 4B is a bottom view that illustrates the electromagnetic interference frame 110. More particularly, the electromagnetic interference gasket 116 is molded into the electromagnetic interference groove 402 on the bottom of the electromagnetic interference frame 110 that interfaces to the circuit board 108 thereby creating a seal for the Faraday Cage 117 (as shown in FIG. 1A). The electromagnetic interference gasket 116 may be reusable in the event that the VLSI module assembly 100 is disassembled and later reassembled.

Also, the electromagnetic interference frame 110 is undercut as shown in element 404 thereby allowing close placement of bypass capacitors and resistors on the circuit board 108 (as shown in FIG. 1A) and minimizing space on the circuit board 108.

FIG. 5 is a side view that illustrates the alignment ball 502 that is attached to the VLSI module 102, and that fits into the alignment socket 302 and the oblong alignment socket 308 of the interposer socket assembly 106. In the present embodiment, the alignment balls 502 are solder balls that are attached to small pads in three of the four extreme corner positions of the VLSI module 102. The alignment balls 502 have a precise alignment with respect to the land grid array 101 of the VLSI module 102 and the pads 105 (as shown in FIG. 1A) of the interposer socket assembly 106. Therefore the alignment balls 502 enable proper placement of the VLSI module 102 when it is assembled onto the interposer socket assembly 106.

The positioning of the electromagnetic interference frame 110 constrains and confines the VLSI module 102 so that in it worst positional alignment the center of the alignment balls 502 are well inside the landing zone of the alignment socket 302 and the oblong alignment socket 308. Due to the spherical shape of the alignment balls 502, when the VLSI module 102 is placed in the electromagnetic interference frame 110 it falls into proper position because of its own weight.

The use of the alignment balls 502 that interface to the alignment socket 302 and the oblong alignment socket 308, combined with the alignment of the electromagnetic interference frame 110 to the interposer socket assembly 106 by the alignment pins 304 (as shown in FIG. 3A) enables the electromagnetic interference frame 110 to be used to prealign the VLSI module 102 as it is assembled in the VLSI module assembly 100 (as shown in FIG. 1A).

Alterative Embodiments

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the VLSI module assembly are presented for purposes of illustration and description. They are not intended to be exhaustive or to limit the invention to the precise forms disclosed, obviously many modifications and variations are possible in view of the above teachings. Those skilled in the art will recognize that changes may be made in form and detail without departing from the scope of the invention. The invention is limited only by the claims.

What is claimed is:

1. A VLSI module assembly comprising:

a circuit board including a land grid array;

a VLSI module for electrical connection to said circuit board, said VLSI module being a land grid array;

an alignment frame attached to said circuit board, said alignment frame circumscribing and enclosing the sides of said VLSI module;

a load spreader connected to said VLSI module and aligned to said alignment frame thereby loading said VLSI module for electrical connection to said circuit board;

an overhead clamp, functioning as a spring, attached to said load spreader with pressure that applies load to said load spreader and to said VLSI module thereby electrically connecting said land grid array of said VLSI module to said land grid array of said circuit board; and a heat sink screw attached to said overhead clamp, and connected to said load spreader thereby evenly applying load to said VLSI module.

2. The VLSI module assembly as set forth in claim 1, wherein said load spreader includes a heat sink so that said VLSI module thermally couples to said heat sink with a sufficiently low resistance thermal path.

3. The VLSI module assembly as set forth in claim 2, wherein said heat sink further includes a heat sink base, and at least one heat fin attached to said heat sink base thereby transferring heat from said VLSI module to said heat sink base and said heat fin.

4. The VLSI module assembly as set forth in claim 1, further comprising:

a pair of electromagnetic interference gaskets that attenuates electromagnetic interference from said VLSI module, said pair of electromagnetic interference gaskets being disposed between said alignment frame and said circuit board and between said alignment frame and said load spreader, a first one of said electromagnetic interference gaskets disposed between said alignment frame and said heat sink being molded into a groove in said alignment frame;

wherein said alignment frame includes electrically conductive material and said circuit board includes a ground plane; said circuit board being attached to said alignment frame thereby attenuating electromagnetic interference from said VLSI module; and said load spreader being connected to said VLSI module and said alignment frame thereby attenuating electromagnetic interference from said VLSI module.

5. A VLSI module assembly comprising:

a circuit board;

a VLSI module being soldered to said circuit board;

an alignment frame shaped to circumscribe and enclose the sides of said VLSI module;

a heat sink aligned to said alignment frame; and an overhead clamp attached to said heat sink and to said alignment frame, then said alignment frame being attached to said circuit board, thereby connecting said heat sink to said soldered VLSI module and absorbing heat from said soldered VLSI module by said heat sink; and a pair of electromagnetic interference gaskets that attenuates electromagnetic interference from said VLSI module, said pair of electromagnetic interference gaskets being disposed between said alignment frame and said circuit board and between said alignment frame and said heat sink, a first one of said electromagnetic interference gaskets disposed between said alignment frame and said heat sink being molded into a groove in said alignment frame.

6. The VLSI module assembly as set forth in claim 1, further comprising an interposer socket assembly attached to said circuit board, and aligned and connected to said VLSI module thereby facilitating electrical connection of said VLSI module to said circuit board.

7. The VLSI module assembly as set forth in claim 6, wherein said heat sink screw evenly applies load to said VLSI module and to said interposer socket assembly thereby electrically connecting, without overload, said VLSI module and said interposer socket to said circuit board.

8. A VLSI module assembly comprising:

a circuit board including a ground plane and a land grid array;

a VLSI module for electrical connection to said circuit board, said VLSI module being a land grid array;

an alignment flame attached to said circuit board, said alignment frame circumscribing and enclosing the sides of said VLSI module, and including electrically conductive material thereby attenuating electromagnetic interference from said VLSI module;

a heat sink connected to said VLSI module and aligned and connected to said alignment frame; thereby loading said VLSI module for electrical connection to said circuit board, thermally coupling said VLSI module to said heat sink with a sufficiently low resistance thermal path, and attenuating electromagnetic interference from said VLSI module;

a pair of electromagnetic interference gaskets that attenuates electromagnetic interference from said VLSI module, said pair of electromagnetic interference gaskets being disposed between said alignment frame and said circuit board and between said alignment frame and said heat sink;

an interposer socket assembly attached to said circuit board, and aligned and connected to said VLSI module thereby facilitating electrical coupling of said VLSI module to said circuit board;

an overhead clamp, functioning as a spring, attached to said heat sink with pressure that applies load to said heat sink and to said VLSI module; and a heat sink screw attached to said overhead clamp, and connected to said heat sink and evenly applying load to said VLSI module and to said interposer socket assembly thereby electrically connecting, without overload, said VLSI module and said interposer socket to said circuit board.

9. A method for creating a VLSI module assembly for a computer system, said computer system having a circuit board including a land grid array and a land grid array VLSI module, said method comprising:

attaching an alignment frame to said circuit board and circumscribing and enclosing the sides of said VLSI module;

connecting a load spreader to said VLSI module and aligning said load spreader to said alignment frame thereby loading said VLSI module for electrical connection to said circuit board;

attaching an overhead clamp, functioning as a spring, to said load spreader with pressure that applies load to said load spreader and to said VLSI module thereby electrically connecting said VLSI module to said circuit board; and attaching a heat sink screw to said overhead clamp, and connecting said heat sink screw to said load spreader thereby evenly applying load to said VLSI module.

10. The method as set forth in claim 9, wherein connecting said load spreader step further includes substituting said load spreader with a heat sink and thermally coupling said heat sink to said VLSI module with a sufficiently low resistance thermal path.

11. The method as set forth in claim 9, further comprising:

sandwiching a pair of electromagnetic interference gaskets between said alignment frame and said circuit board and between said alignment frame and said load spreader thereby attenuating electromagnetic interference from said VLSI module, a first one of said electromagnetic interference gaskets disposed between said alignment frame and said heat sink being molded into a groove in said alignment frame;

attaching said alignment frame to said circuit board, wherein said alignment frame includes electrically conductive material and said circuit board includes a ground plane, thereby attenuating electromagnetic interference from said VLSI module; and connecting said load spreader to said VLSI module and said alignment frame thereby attenuating electromagnetic interference from said VLSI module.

12. A method for creating a VLSI module assembly for a computer system, said computer system having a circuit board and a VLSI module, said method comprising:

mounting said VLSI module to said circuit board;

installing an alignment frame to circumscribe and enclose the sides of said VLSI module;

aligning a heat sink to said alignment frame;

attaching an overhead clamp to said heat sink and to said alignment frame, then attaching said alignment frame to said circuit board, thereby connecting said heat sink to said mounted VLSI module and absorbing heat from said mounted VLSI module by said heat sink; and sandwiching a pair of electromagnetic interference gaskets between said alignment frame and said circuit board and between said alignment frame and said heat sink thereby attenuating electromagnetic interference from said VLSI module, a first one of said electromagnetic interference gaskets disposed between said alignment frame and said heat sink being molded into a groove in said alignment frame.

13. The method as set forth in claim 9, further comprising attaching an interposer socket assembly to said circuit board, and aligning and connecting said interposer socket assembly to said VLSI module thereby facilitating electrical connection of said VLSI module to said circuit board.

14. The method set forth in claim 13, wherein said attaching a heat sink screw to said overhead clamp, and connecting said heat sink screw to said load spreader evenly applies load to said VLSI module and to said interposer socket assembly thereby electrically connecting, without overload, said VLSI module and said interposer socket to said circuit board.

* * * * *